(12) United States Patent
Teo et al.

(10) Patent No.: US 11,152,471 B1
(45) Date of Patent: Oct. 19, 2021

(54) 2-DIMENSIONAL ELECTRON GAS AND 2-DIMENSIONAL HOLE GAS JUNCTION BASED SEMICONDUCTOR DEVICE

(71) Applicant: Mitsubishi Electric Research Laboratories, Inc., Cambridge, MA (US)

(72) Inventors: Koon Hoo Teo, Lexington, MA (US); Nadim Chowdhury, Cambridge, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 26 days.

(21) Appl. No.: 16/830,324

(22) Filed: Mar. 26, 2020

(51) Int. Cl.
*H01L 29/205* (2006.01)
*H01L 29/20* (2006.01)
*H01L 29/45* (2006.01)
*H01L 29/861* (2006.01)

(52) U.S. Cl.
CPC ........ *H01L 29/205* (2013.01); *H01L 29/2003* (2013.01); *H01L 29/452* (2013.01); *H01L 29/861* (2013.01)

(58) Field of Classification Search
None
See application file for complete search history.

(56) References Cited

U.S. PATENT DOCUMENTS

| | | | | |
|---|---|---|---|---|
| 4,830,980 A | * | 5/1989 | Hsieh | H01L 21/7605 257/274 |
| 2014/0091310 A1 | * | 4/2014 | Jeon | H01L 21/8252 257/76 |
| 2015/0041820 A1 | * | 2/2015 | Renaud | H01L 27/085 257/76 |
| 2017/0018639 A1 | * | 1/2017 | Teo | H01L 21/8258 |

* cited by examiner

*Primary Examiner* — Khaja Ahmad
(74) *Attorney, Agent, or Firm* — Gennadiy Vinokur; Hironori Tsukamoto

(57) ABSTRACT

Semiconductor devices including a first region having a first three Nitride (III-N) layer and a second III-N layer, the second III-N layer is over the first III-N. The second III-N layer has spontaneous polarization less than the first III-N layer, such that a two-dimensional hole gas (2-DHG) will be formed at a junction of the first III-N layer to the second III-N layer. An Anode forms an ohmic contact to the 2-DHG. A second region includes a third III-N layer and a forth III-N layer, such that the fourth III-N layer is over the third III-N. The forth III-N layer has spontaneous polarization greater than the third III-N layer, such that two-dimensional electron gas (2-DEG) will be formed at a junction of the third III-N layer to the forth III-N layer. A Cathode forms an ohmic contact to the 2-DEG. The first and second regions are connected at an interface.

20 Claims, 8 Drawing Sheets

2-DIMENSIONAL ELECTRON GAS AND 2-DIMENSIONAL HOLE GAS JUNCTION BASED SEMICONDUCTOR DEVICE

FIELD

The present disclosure relates to the field of semiconductor devices, and more particularly, a semiconductor device that is a diode like device that is operational at cryogenic temperatures.

BACKGROUND

Superconductor electronics (SCE) based on Josephson junctions (JJs) offers several options in the beyond Moore's law timeframe. Digital superconductor electronics based on single flux quantum (SFQ) logic is an area being researched to further understand SFQ logic in several logic families at an integration level up to about one million devices per chip. Superconductor electronics has been seen as an option for supercomputers since its inception in the 1960s, although the term "supercomputer" has broadened to include data centers. Quantum information processing (QIP) is a rapidly evolving area that includes areas such as quantum computing and quantum artificial intelligence. Quantum computers have been seen as ultra-powerful computers in limited domains since the discovery of Shor's algorithm for factoring numbers.

For example, a quantum computer is a computational system that uses collective quantum-mechanical phenomena of atoms at a high quantum degenerate regime, to process data. Unlike digital computers in which data is encoded into binary digits (bits) in one of two definite states ("0" or "1"), the quantum computation requires data to be encoded into qubits (quantum bits), where a single qubit can represent a "1", a "0", or any quantum superposition of the two qubit states. In general, a quantum computer with N qubits can be in an arbitrary superposition of up to $2^N$ different states simultaneously, i.e., a pair of qubits can be in any quantum superposition of four states, and three qubits in any superposition of eight states. Wherein, large-scale quantum computers may be to solve certain problems much more quickly than digital computers. In the operation of a quantum computer, the computations are initialized by setting the qubits in a controlled initial state. By manipulating those qubits, predetermined sequences of quantum logic gates are realized that represent the problem to be solved, called a quantum algorithm. Quantum algorithms, such as Shor's algorithm, Simon's algorithm, etc., run faster than any possible probabilistic classical algorithm. Quantum algorithms are often non-deterministic, as they provide the correct solution only with a certain known probability. The computation is finalized with a measurement, which collapses the system of qubits into one of the $2^N$ pure states, where each qubit is purely "0" or "1".

A number of different types of quantum computers have been developed. For example, a trapped ion quantum computer is a type of quantum computer in which ions, or charged atomic particles, can be confined and suspended in free space using electromagnetic fields. Qubits are stored in stable electronic states of each ion, and quantum information can be processed and transferred through the collective quantized motion of the ions in the trap (interacting through the Coulomb force).

U.S. Pat. No. 5,793,091A developed quantum computer architecture based upon arrays of elliptical ion traps. Each ion trap contains multiple ions, with each ion storing a physical qubit. Single qubit operations on ions are performed using properly timed laser pulses. Two qubit and quantum communication operations between ions in a single trap are mediated by collective phonon modes of the trapped ions. Quantum communication between ions in different traps is accomplished by placing the traps in a cavity, and using the photon cavity modes to mediate between the designated spatially separated ions. However, the U.S. Pat. No. 5,793,091A architecture does not address the classical control electronics and software necessary to perform the various quantum algorithms. Additionally, the physical location of the ion traps must be such that a cavity photon mode is able to transmit quantum information from one trap to another; distributed ion traps are not supported, and error-correction is also not addressed by the architecture. Also, the U.S. Pat. No. 5,793,091A architecture fails to provide all the components necessary for a complete architecture for a quantum computer: local quantum computation, distributed quantum computation, classical control electronics, classical control software, and error-correction.

Accordingly, with the rise of quantum computing, there is need to overcome the problems with conventional electronics that do not work properly in sub-4 K temperatures because of carrier freeze-out effect, and to improve quantum computer control electronics for quantum computing.

SUMMARY

The present disclosure relates to the field of semiconductor devices, and more particularly, a semiconductor device that is a diode like device that is operational at cryogenic temperatures Some embodiments of the present disclosure include a semiconductor device including a first region. The first region includes a first three Nitride (III-N) layer and a second layer, such that the second III-N layer is over the first III-N. Wherein the second III-N layer has spontaneous polarization less than a spontaneous polarization of the first III-N layer, such that two-dimensional hole gas (2-DHG) will be formed at a junction of the first III-N layer to the second III-N layer. An Anode is arranged to form an ohmic contact to the 2-DHG at the junction of the first III-N layer to the second III-N layer. A second region includes a third III-N layer and a forth III-N layer, such that the fourth III-N layer is over the third III-N. Wherein the forth III-N layer has spontaneous polarization greater than a spontaneous polarization of the third III-N layer, such that two-dimensional electron gas (2-DEG) will be formed at a junction of the third III-N layer to the forth III-N layer. A Cathode is arranged to form an ohmic contact to the 2-DEG at the junction of the third III-N layer to the forth III-N layer. Wherein the first region and the second region are connected at a region interface that is a straight line, and that the 2-DHG and the 2-DEG are aligned to form a junction.

However, in order to better appreciate the challenges, overcome by the present disclosure, one needs to gain insight about some of the conventional problems of today's conventional quantum computers. An initial challenge to overcome with conventional quantum computers is developing a quantum computer that eliminates the requirement of having to use conventional electronic equipment to obtain a working quantum computer. In particular, the present disclosure has made several realizations that overcome using conventional electronics by creating a single device for quantum computing that essentially combines the features of conventional electronic equipment with the components of quantum computing, i.e. without having to use conventional electronics. At least one reason to eliminate using conventional electronic components with quantum computing components is the conventional electronics operate at one temperate, i.e. room temperature, and the quantum computing components operate at a different temperature, i.e. at sub-zero temperature.

Conventional electronics used with quantum computing are utilized for qubit control and read-out (i.e., shaping electrical pulses, amplification, etc.). For example, a qubit (or quantum bit) is a basic container of information in a quantum computer, which replaces the conventional basic container of information, i.e. "a bit", in the conventional computer. Conventional electronic components operate at room temperature, whereas most qubits of quantum computing operate at near absolute zero, which creates a requirement to support electronics that can operate at millikelvin (mK) operating temperatures, to avoid unacceptable cooling load. Conventional electronics do not work properly in sub-4 K temperature because of carrier freeze-out effect. Conventional electronics do not operate at lower temperature limits is due to the temperature effect of lowering the ionization energy of dopants in the conventional electronics. Dopants are impurity elements added to a semiconductor crystal to form electrical junctions or boundaries between "n" and "p" regions in the crystal. An n-type region is an area containing an excess of electrons for conduction of electricity. A p-type region contains an excess of electron holes or acceptors. Dopants usually require some energy to ionize and produce carriers in the semiconductor. This energy is usually thermal, and if the temperature is too low, the dopants will not be sufficiently ionized and there will be insufficient carriers, i.e. a lack of carriers means there is little or no current flow. The result is a condition called "freeze-out."

Semiconductor devices operate by means of the movement of charge carriers (electrons and holes). The key is controlling their movement through arrangement of n-type, p-type, and intrinsic regions (and insulators) that have different electrical properties. A simple example is the p-n junction, which as a result of different doping on the two sides of the junction, can favor carrier movement in one direction across the junction but not in the opposite direction. Which means that temperature is one of the most important parameters in semiconductors. When the absolute scale is mentioned in the present disclosure, this refers, in degrees Kelvin, which is written as 300 K or 0 K, etc., without a degree symbol because it is absolute temperature. Temperature is very important at least because the average energy of a solid, and its components (atoms, electrons, etc.), is measured by its temperature. The higher the temperature, the more (thermal) energy is available to be used by the atoms and electrons. In regard to temperature and the operation of conventional "electronic" devices, temperature has a significant impact on the behavior of electrons, which means, temperature must have a significant impact on the behavior of electronic devices. For example, an average kinetic energy of an electron in a solid is linearly proportional to the temperature of the solid, such that at room temperature, an average velocity of a free electron is approximately $1^7$ cm/sec. Whereas, at an average velocity of a free electron at absolute zero is about at the electron's lowest energy state. Thus, there many challenges to figuring out how electronics can work in cryogenic temperatures, as well as a need for the electronics to operate at extremely energy efficient levels.

At least one realization of the present disclosure is to construct a semiconductor device that eliminates the need for conventional electronics, and essentially, combines the utility of conventional electronics into a single device that can operate at sub-zero temperatures. However, this realization is contrary to conventional thinking since today's quantum computing which requires a significant amount of classical information processing via conventional electronic components, i.e. control processing unit, to compute the quantum operations needed to correct errors based upon measured syndrome results, along with requiring a lot of extra time for this processing that slows the operation of the quantum computer. For example, an initial experimentation started with a modular quantum computer architecture with hierarchy of interactions between qubits that supported the scaling of a large number of qubits, and for forming quantum computational circuits. However, in order for this test quantum computer to operate, this experimentation architecture required a control processor unit (CPU) to process an efficient error correction mechanism and intelligent coding schemes for a fault-tolerance of operation. This testing approach was not further tested because it failed to meet some of the goals of the present disclosure of creating a single device operating at a single temperate to result in aspects of quantum computing.

Another realization of the present disclosure, discovered from further experimentation, is utilizing a polarization based doping as an effective way to circumvent the problem of operating components similar to a conventional quantum computing device that requires two operational temperatures, and instead, having a single device operating at sub-zero temperature, i.e. at a single operational temperature, since the carriers are not provided by the dopants.

The polarization doping is used to generate free electrons. This free electrons are created at the interface of two semiconductor materials having two different spontaneous polarization. For example, some embodiments of the present disclosure include a single semiconductor device that utilizes the polarization based doping to generate free electrons and free holes.

Diode is a two terminal electronic device that allows the current to be conducted in one direction and block the conduction in the the other direction when a voltage is applied across its terminals. When no voltage is applied between anode and cathode of the device, there exists an energy barrier at the junction of 2-DEG and 2-DHG and because of this energy barrier there is no flow of carrier between the anode and cathode. When a positive voltage is applied between the anode and the cathode the energy barrier is reduced which allows the carriers to be flow across the junction which leads to the conduction of current between the anode and cathode. On the contrary if a negative voltage is applied across the anode and cathode the energy barrier at the junction of 2-DEG and 2-DHG is increased which blocks the carriers and hence the flow of current. This is how the device operated as a diode.

Practical Applications

Some benefits and advantages of quantum computing is that an amount of time for a quantum computer to run several times, that amount of time, is still exponentially faster to arrive at a result of a very hard problem to solve, than using a conventional computer. An amount of time for a single run-time for a conventional computer to work on the same very hard problem, equates or corresponds to the amount of time the quantum computer takes run several times. In regard to the many complex problems that need to be solved in today's demands, the need for quantum computing is characterized by this 'very hard' exponential growth in problem solving complexity. For example, the embodiments of the present disclosure can thus provide for faster computational times for optimization problems, machine learning, sampling of large data sets, forecasting etc, by non-limiting example. In addition, the embodiments of the present disclosure can address the growing need for the solving these complex problems via the quantum computing attributes of the present disclosure.

Specifically, what makes quantum computers unique is based on introducing two principles of quantum mechanics crucial for their operation, superposition and entanglement.

Superposition is the counterintuitive ability of a quantum object, like an electron, to simultaneously exist in multiple "states." With an electron, one of these states may be the lowest energy level in an atom while another may be the first excited level. If an electron is prepared in a superposition of these two states it has some probability of being in the lower state and some probability of being in the upper. A measurement will destroy this superposition, and only then can it be said that it is in the lower or upper state.

Some embodiments of the present disclosure provide a platform such that this configuration of quantum computing hardware can be built on control electronics (CPU) unit. At least one aspect of this arrangement is with a chip integration on the CPU and quantum computing, results in making the whole Quantum computing process even faster, i.e. when compared to convention systems that require two separate temperature zones, one for conventional electronics at room temperature and the other for quantum computing at zero temperatures. For example, understanding superposition makes it possible to understand the basic component of information in quantum computing, the qubit. In conventional computing, bits are transistors that can be off or on, corresponding to the states 0 and 1. In qubits such as electrons, 0 and 1 simply correspond to states like the lower and upper energy levels discussed above. Qubits are distinguished from classical bits, which must always be in the 0 or 1 state, by their ability to be in superpositions with varying probabilities that can be manipulated by quantum operations during computations.

Entanglement is a phenomenon in which quantum entities are created and/or manipulated such that none of them can be described without referencing the others. Individual identities are lost. This concept is exceedingly difficult to conceptualize when one considers how entanglement can persist over long distances. A measurement on one member of an entangled pair will immediately determine measurements on its partner, making it appear as if information can travel faster than the speed of light. As noted above, some embodiments provide a platform for an integrated quantum computer, such that all this quantum computing hardware can be built on control electronics (CPU) unit this on chip integration of CPU and quantum computing making the whole Quantum computing process even faster.

One way of thinking of quantum computing is that the computing tries every possible answer to solve a problem in parallel. In reality a quantum computer leverages entanglement between qubits and the probabilities associated with superpositions to carry out a series of operations (a quantum algorithm) such that certain probabilities are enhanced (i.e., those of the right answers) and others depressed, even to zero (i.e., those of the wrong answers). When a measurement is made at the end of a computation, the probability of measuring the correct answer should be maximized. The way quantum computers leverage probabilities and entanglement is what makes them so different from classical computers. As noted above, some embodiments provide a platform for an integrated quantum computer.

Some reasons why quantum computed is needed can be the promise of developing a quantum computer sophisticated enough to execute Shor's algorithm for large numbers, i.e. which has been a primary motivator for advancing the field of quantum computation. For example, if a quantum computer with a sufficient number of qubits could operate without succumbing to quantum noise and other quantum-decoherence phenomena, then Shor's algorithm could be used to break public-key cryptography schemes, such as the widely-used Rivest-Shamir-Adleman (RSA) scheme, i.e. RSA encryption is based on a simple idea: prime factorization, which is an algorithm used to encrypt and decrypt messages. As noted above, quantum computers can most likely help with specific problems, including problems related to optimization, which can play key roles in everything from defense to financial trading. As noted above, some embodiments provide a platform for an integrated quantum computer.

Multiple additional applications for qubit systems that are not related to computing or simulation also exist, which can include: (1) quantum sensing and metrology, which leverage the extreme sensitivity of qubits to an environment to realize sensing beyond the conventional shot noise limit; and (2) quantum networks and communications, which may lead to revolutionary ways to share information. As noted above, some embodiments provide a platform for an integrated quantum computer.

According to an embodiment of the present disclosure, a semiconductor device including a first region. The first region includes a first three Nitride (III-N) layer and a second III-N layer, such that the second III-N layer is over the first III-N. Wherein the second III-N layer has spontaneous polarization less than a spontaneous polarization of the first III-N layer, such that two-dimensional hole gas (2-DHG) will be formed at a junction of the first III-N layer to the second III-N layer. An Anode is arranged to form an ohmic contact to the 2-DHG at the junction of the first III-N layer to the second III-N layer. A second region includes a third III-N layer and a forth III-N layer, such that the fourth III-N layer is over the third III-N. Wherein the forth III-N layer has spontaneous polarization greater than a spontaneous polarization of the third III-N layer, such that two-dimensional electron gas (2-DEG) will be formed at a junction of the third III-N layer to the forth III-N layer. A Cathode is arranged to form an ohmic contact to the 2-DEG at the junction of the third III-N layer to the forth III-N layer. Wherein the first region and the second region are connected at a region interface that is a straight line, and that the 2-DHG and the 2-DEG are aligned to form a junction.

Another embodiment of the present disclosure, a semiconductor device including a first region including a first three Nitride (III-N) layer and a second III-N layer, such that the second III-N layer is over the first III-N. Wherein the second III-N layer has spontaneous polarization less than a spontaneous polarization of the first III-N layer, such that two-dimensional hole gas (2-DHG) will be formed at a junction of the first III-N layer to the second III-N layer. An Anode is arranged to form an ohmic contact to the 2-DHG at the junction of the first III-N layer to the second III-N layer. A second region includes a third III-N layer and a forth III-N layer, such that the forth III-N layer is over the third III-N. Wherein the forth III-N layer has spontaneous polarization greater than a spontaneous polarization of the third III-N layer, such that two-dimensional electron gas (2-DEG) will be formed at a junction of the third III-N layer to the forth III-N layer. A Cathode is arranged to form an ohmic contact to the 2-DEG at the junction of the third III-N layer to the forth III-N layer. Wherein a current flows from the Anode to the Cathode, when a positive voltage is applied to the Anode with respect to the Cathode. Wherein the first region and the second region are connected at a region interface that is a straight line, and that the 2-DHG and the 2-DEG are aligned to form a junction.

Another embodiment of the present disclosure, a semiconductor device including a first region including a first three Nitride (III-N) layer and a second III-N layer, such that the second III-N layer is over the first III-N. Wherein the second III-N layer has spontaneous polarization less than a spontaneous polarization of the first III-N layer, such that two-dimensional hole gas (2-DHG) will be formed at a junction of the first III-N layer to the second III-N layer. An Anode is arranged to form an ohmic contact to the 2-DHG at the junction of the first III-N layer to the second III-N layer. A second region includes a third III-N layer and a forth III-N layer, such that the forth III-N layer is over the third III-N. Wherein the forth III-N layer has spontaneous polarization greater than a spontaneous polarization of the third III-N layer, such that two-dimensional electron gas (2-DEG) will be formed at a junction of the third III-N layer to the forth III-N layer. A Cathode is arranged to form an ohmic contact to the 2-DEG at the junction of the third III-N layer to the forth III-N layer. Wherein the first region and the second region are connected at a region interface that is a straight line. Wherein a junction is formed between the 2-DHG and the 2-DEG that forms a depletion width that is varied by applying bias at the Anode with respect to the Cathode.

BRIEF DESCRIPTION OF THE DRAWINGS

The presently disclosed embodiments will be further explained with reference to the attached drawings. The drawings shown are not necessarily to scale, with emphasis instead generally being placed upon illustrating the principles of the presently disclosed embodiments.

While the above-identified drawings set forth presently disclosed embodiments, other embodiments are also contemplated, as noted in the discussion. This disclosure presents illustrative embodiments by way of representation and not limitation. Those skilled in the art can devise numerous other modifications and embodiments, which fall within the scope and spirit of the principles of the presently disclosed embodiments.

DETAILED DESCRIPTION

Figure 1A:
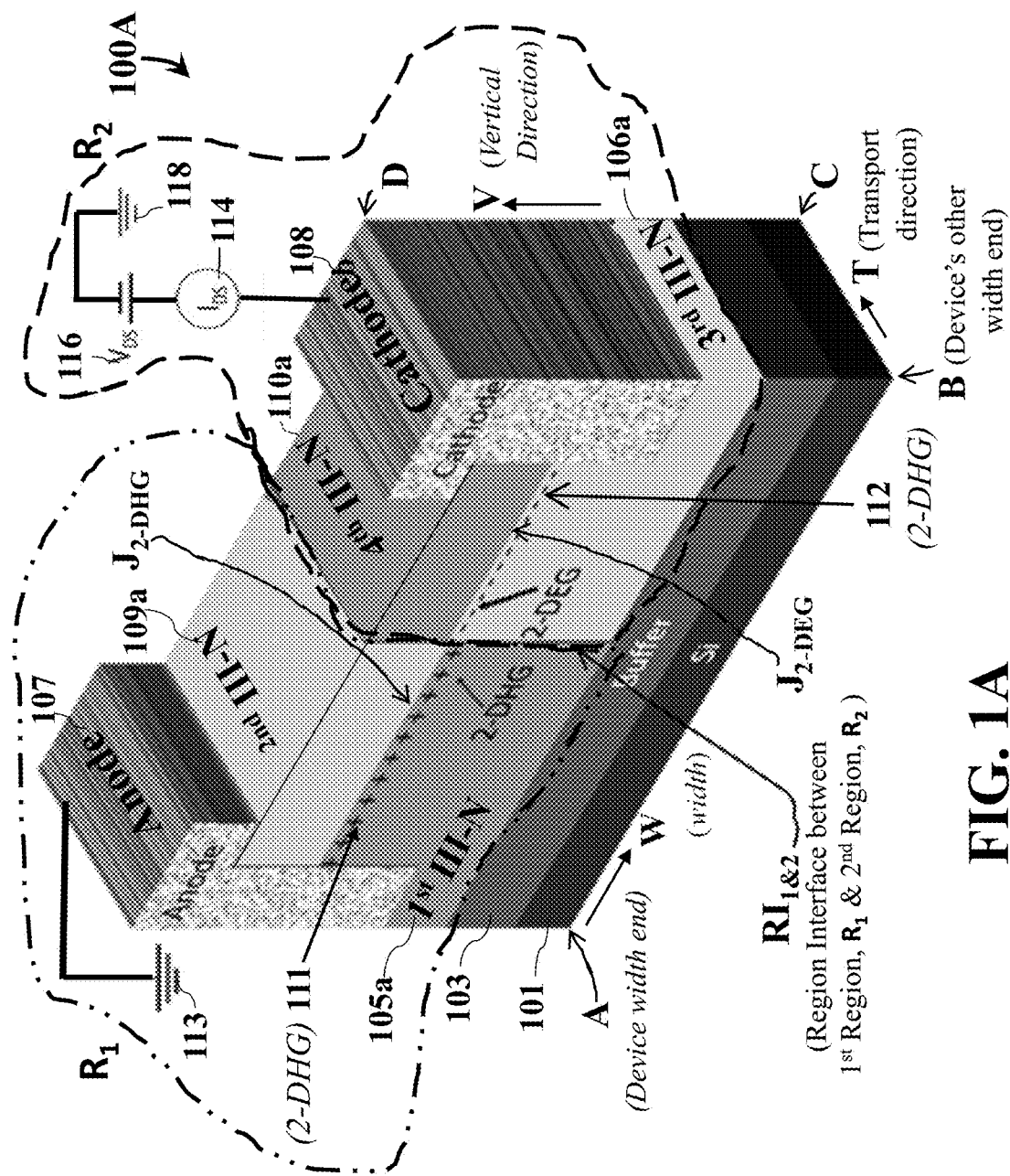
FIG. 1A is a schematic illustrating a three-dimensional (3D) view of a semiconductor device, according to an embodiment of the present disclosure.

FIG. 1A is a schematic illustrating a three-dimensional (3D) view of a semiconductor device, according to an embodiment of the present disclosure. FIG. 1A shows a semiconductor device 100A have a first region $R_1$. The first region $R_1$ includes a first three Nitride (III-N) layer 105a and a second III-N layer 109a, such that the second III-N layer 109a is over the first III-N 105a. Wherein the second III-N layer 109a has spontaneous polarization less than a spontaneous polarization of the first III-N layer 105a, such that two-dimensional hole gas (2-DHG) 111 will be formed at a junction $J_{2\text{-}DHG}$ of the first III-N layer 105a to the second III-N layer 109a. An Anode 107 is arranged to form an ohmic contact to the 2-DHG 111 at the junction $J_{2\text{-}DHG}$ of the first III-N layer 105a to the second III-N layer 109a.

A second region $R_2$ includes a third III-N layer 106a and a forth III-N layer 110a, such that the fourth III-N layer 110a is over the third III-N 106a. Wherein the forth III-N layer 110a has spontaneous polarization greater than a spontaneous polarization of the third III-N layer 106a, such that two-dimensional electron gas (2-DEG) will be formed at a junction $J_{2\text{-}DEG}$ of the third III-N layer 106a to the forth III-N layer 110a. A Cathode 108 is arranged to form an ohmic contact to the 2-DEG at the junction $J_{2\text{-}DEG}$ of the third III-N layer 106a to the forth III-N layer 110a. Wherein the first region $R_1$ and the second region $R_2$ are connected at a region interface $R_{1\ and\ 2}$ that is a straight line, and that the 2-DHG and the 2-DEG are aligned to form a junction $J_{2\text{-}DHG/2\text{-}DEG}$.

Still referring to FIG. 1A, a first end of a device width A, extends to another device width end B, and represents a width direction W. Further, from the another device width end B to a location C, represents the transport direction of the electrons flow. Also, from location C to location D, represents a device vertical direction V. The anode 107 includes a ground 118, and the cathode 108 has an applied voltage between the anode 107 and the cathode 108 of the device 100A to read the state of the device 100A connected to a ground 118. $V_{DS}$ 116 is the read voltage and can be positive or negative relative to the ground 118. IDS 114 is the anode-to-cathode current coming out from the device 100A. IDS 114 is a resistance state of the device 100A. It can be either a high resistance state or a low resistance state, depending on the polarity of the applied voltage.

Figure 1B:
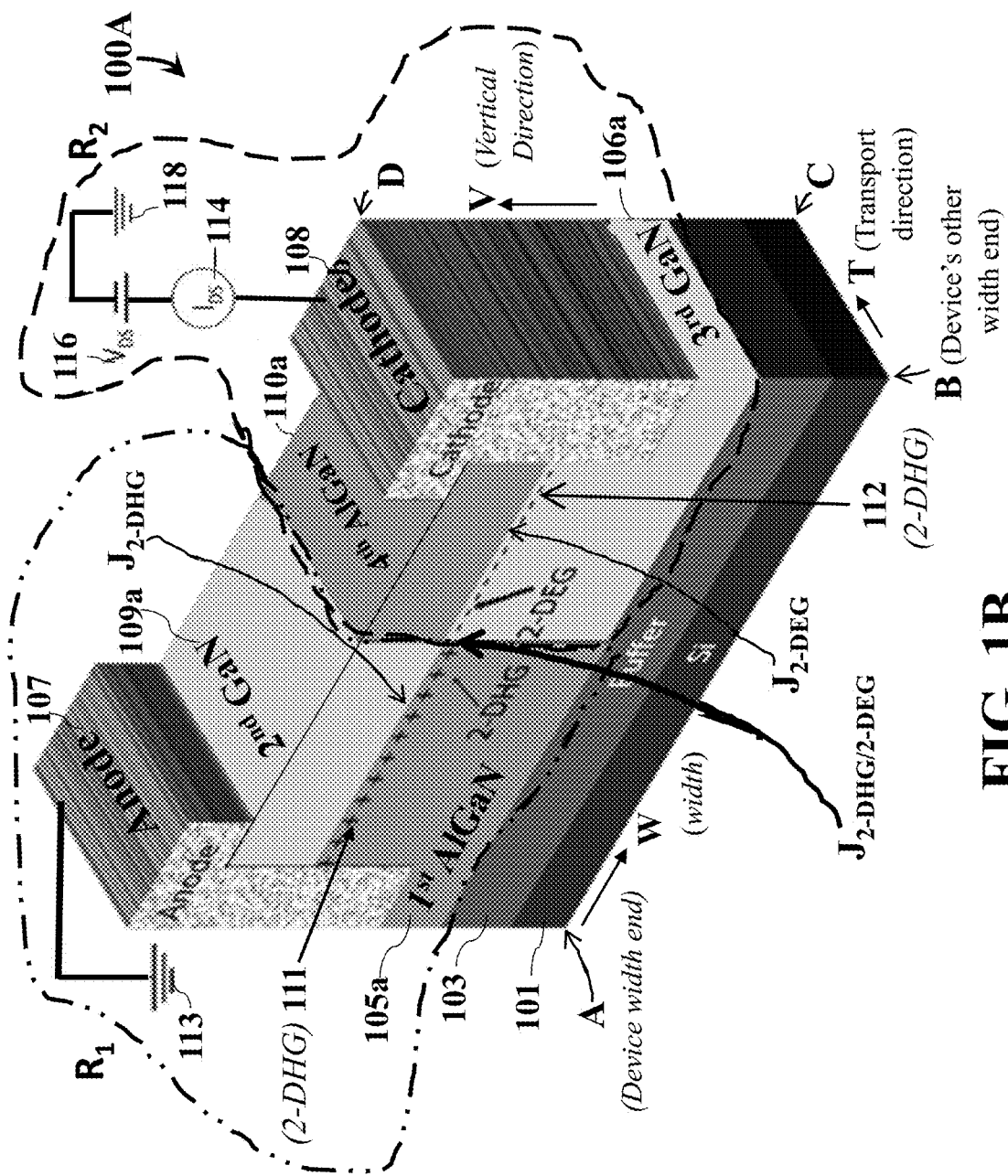
FIG. 1B is a schematic illustrating another three-dimensional (3D) view of the semiconductor device of FIG. 1A, further providing types of material for the first, second, third and fourth III-N layers, according to some embodiments of the present disclosure.

FIG. 1B is a schematic illustrating another three-dimensional (3D) view of the semiconductor device of FIG. 1A, further providing types of material for the first, second, third and fourth III-N layers, according to some embodiments of the present disclosure. For example, FIG. 1B shows a semiconductor device 100B have the first region $R_1$. The first region $R_1$ includes the first III-N layer, wherein the materials can include an aluminum gallium nitride (AlGaN) layer 105b (first III-N layer), and the second III-N layer, wherein the materials can include a gallium nitride (GaN)

layer 109b (second III-N layer), such that the GaN layer 109b (second III-N layer) is over the AlGaN layer 105b (first III-N layer). Wherein the GaN layer 109b (second III-N layer) has spontaneous polarization less than a spontaneous polarization of the AlGaN layer 105b (first III-N layer).

A second region $R_2$ includes the third III-N layer, wherein the materials can include a GaN layer 106b, and the forth III-N layer, wherein the materials can include an AlGaN layer 110b, such that the AlGaN layer 110b (fourth III-N layer) is over the GaN layer 106b (third III-N layer). Wherein the AlGaN layer 110b (fourth III-N layer) has spontaneous polarization greater than a spontaneous polarization of the GaN layer 106b (third III-N layer), such that two-dimensional electron gas (2-DEG) will be formed at the junction $J_2$-DEG of the GaN layer 106b (third III-N layer) to the AlGaN layer 110b (fourth III-N layer).

Figure 1C:
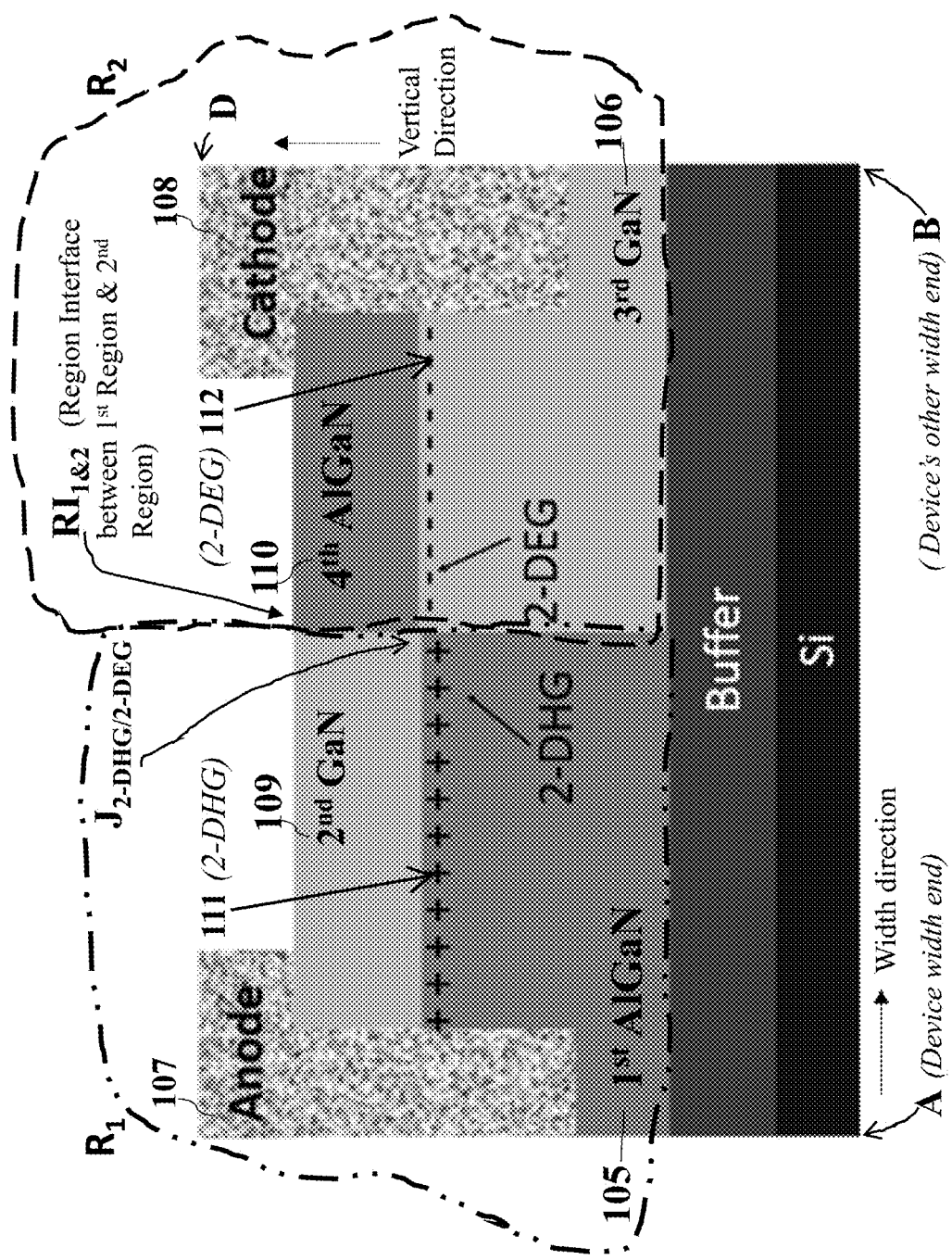
FIG. 1C is a schematic illustrating a cross section of the semiconductor device of FIG. 1B, according to some embodiments of the present disclosure.

FIG. 1C is a schematic illustrating a cross section of the semiconductor device of FIG. 1B, according to some embodiments of the present disclosure. FIG. 1C shows that in the first region $R_1$, the first AlGaN layer (first III-N layer) has about 10× times larger (or is about 1000% times larger), then the second GaN layer (second III-N layer). Also, that in the second region $R_2$, the third GaN layer (third III-N layer) has about 10× times larger (or is about 1000% times larger), then the fourth AlGaN layer (fourth III-N layer).

Two-Dimensional Electron Gas (2-DEG)

Unlike conventional HEMTs made of modulation-doped semiconductor heterostructures, no intentional doping is required to generate two-dimensional electron gas (2-DEG) at the AlGaN/GaN interface. Some problems to further develop AlGaN/GaN HEMT is a lack of a better understanding the origin of 2-DEG. The large interface charge density in this system is correlated to the spontaneous and piezo-electric polarization and results in a high electric field in the AlGaN barrier layer, but the source of the large quantity of electrons is not fully understood. From experimentation we believe that the 2DEG originates from the donor states on the AlGaN surface. We were not able to completely understand the process of this formation of 2-DEG. We think that an accurate expression of the sheet carrier concentration of 2DEG ns is mostly likely an important aspect to further the development of AlGaN/GaN HEMTs.

From experimentation, the 2DEG is considered to be caused by a net polarization charge of AlGaN and GaN (i.e., $\sigma_{pol}=\sigma_{AlGaN}-\sigma_{GaN}$). This term of polarization sheet charge density a is regarded as a parameter to be determined, which means that the value of a needs to be calculated by fitting to experiment results, rather than defined before fitting. Learned from experimentation, the polarization effect of an AlGaN layer grown on a GaN buffer induces positive polarization charge at the Al—GaN/GaN interface, and negative polarization charge at the top of the AlGaN layer. Thus, an electric field is formed within the AlGaN layer. So, one can think that the AlGaN surface and the AlGaN/GaN interface are two infinite charged planes, and because the thickness of the epilayer is just several μm, we know that this is very small in comparison to a lateral size of the substrate.

The formation of 2DEG of an AlGaN/GaN heterostructure with an n-doped AlGaN layer is such that, in the AlGaN layer, the positive polarization charge at the Al—GaN/GaN interface and the negative polarization charge at the top of the AlGaN layer induce an electric field and make an energy band (along with the Fermi level) tilt toward the inter-face. This situation is equal to applying a voltage to a piece of thin freestanding AlGaN film, or this is like, a planar plate capacitor with AlGaN dielectric medium. Under the force of the electric field, conducting electrons, where the AlGaN layer is n-doped, the AlGaN moves to the positive electrode and accumulates there, leaving positive space charges in AlGaN, bending the energy band and making the Fermi level flat again. Also, the built-in electric field will reduce the whole electric field in the AlGaN layer and thus make the inclined energy band flatter. Once contacting GaN, electrons on the AlGaN side will flow into the GaN and form 2DEG, because the Fermi level of GaN is lower than that of AlGaN. This process continues until the Fermi levels of AlGaN and GaN become equal to each other.

In trying to better understand where the 2DEG comes from, we know that the 2DEG does not come from the GaN buffer. A total polarization charge at the AlGaN/GaN interface is divided into two parts. The first part comes from AlGaN, and the other part comes from GaN. The AlGaN part has no effect on the GaN side because the negative polarization charge at the top of the AlGaN layer and the positive polarization charge at the interface forms a planar plate capacitor, which generates no electric field out-side its two planes. Similarly, the GaN part, together with its counterpart at the bottom of the GaN layer, generates a uniform electric field pointing from the bottom of the GaN layer toward the AlGaN/GaN interface. This electric field will reduce the net electron density at the AlGaN/GaN interface, let alone form 2DEG. Also, the 2DEG cannot come from the body of the AlGaN barrier because there are few conductive electrons in undoped AlGaN Two-Dimensional Hole Gas (2-DHG)

2-DHG is a model in solid-state physics. It is a hole gas that is free to move in two dimensions, but tightly confined in the third direction. This tight confinement leads to quantized energy levels for motion in the third direction, which can then be ignored for most problems. Thus, the holes appear to be a 2D sheet embedded in a 3D world. The analogous construct of holes is called a two-dimensional hole gas (2-DHG), and such systems have many useful and interesting properties. Because of the difference in the spontaneous and piezo electric polarization charge of GaN and AlGaN there exists a net polarization charge at the interface of GaN and AlGaN. When GaN layer is on top of AlGaN layer this polarization charge is negative. This polarization charge is immobile and cannot contribute to the transport. However, to satisfy the conservation of charge neutrality it attracts the holes which has positive charge from the GaN surface to accumulate at the interface of GaN and AlGaN.

Figure 2A:
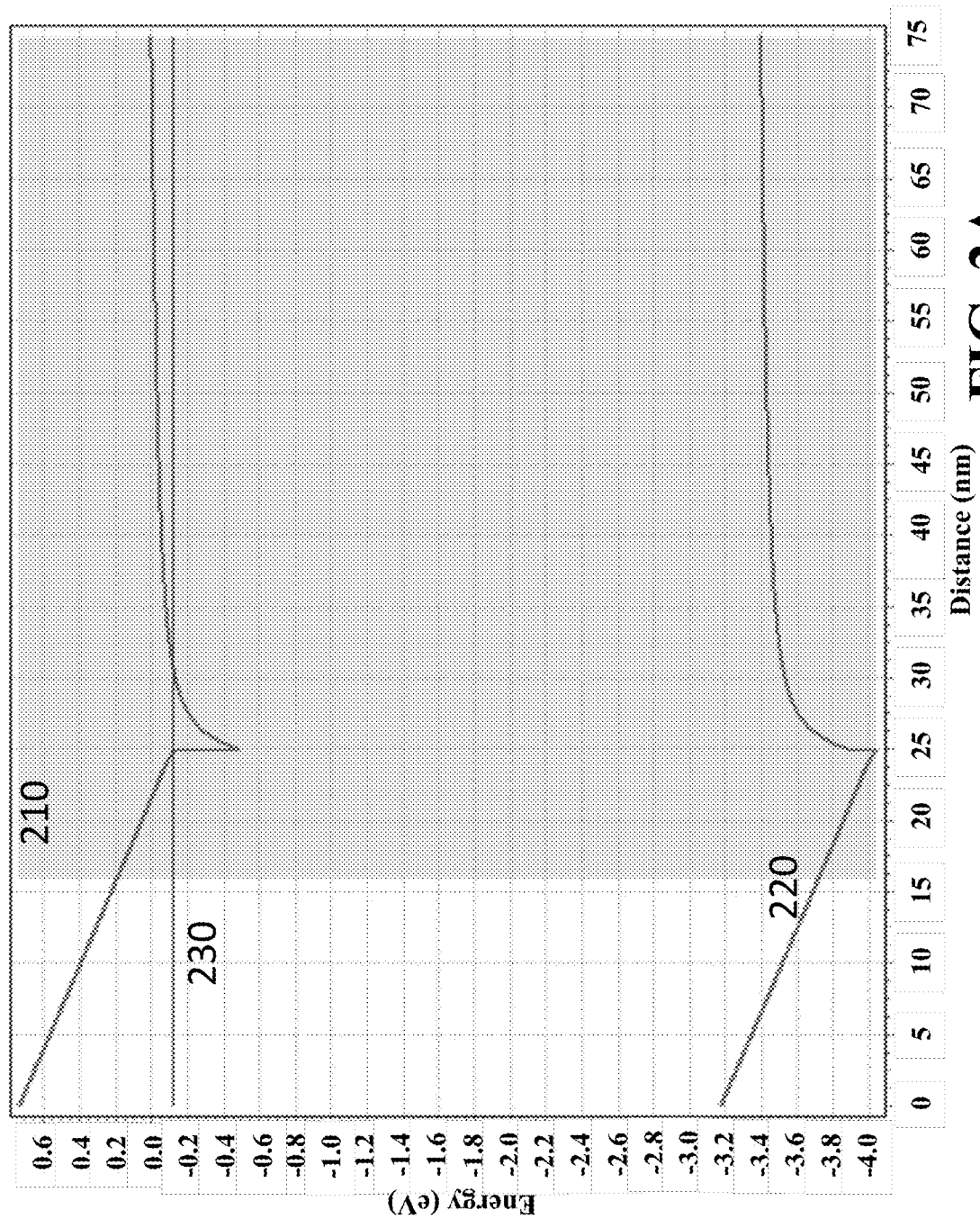
FIG. 2A is a graph illustrating that because of a polarization charge difference between the AlGaN and GaN, 2-DEG is formed at the hetero-interface of AlGaN/GaN, shows a band diagram of AlGaN/GaN interface, according to some embodiments of the present disclosure.
Figure 2B:
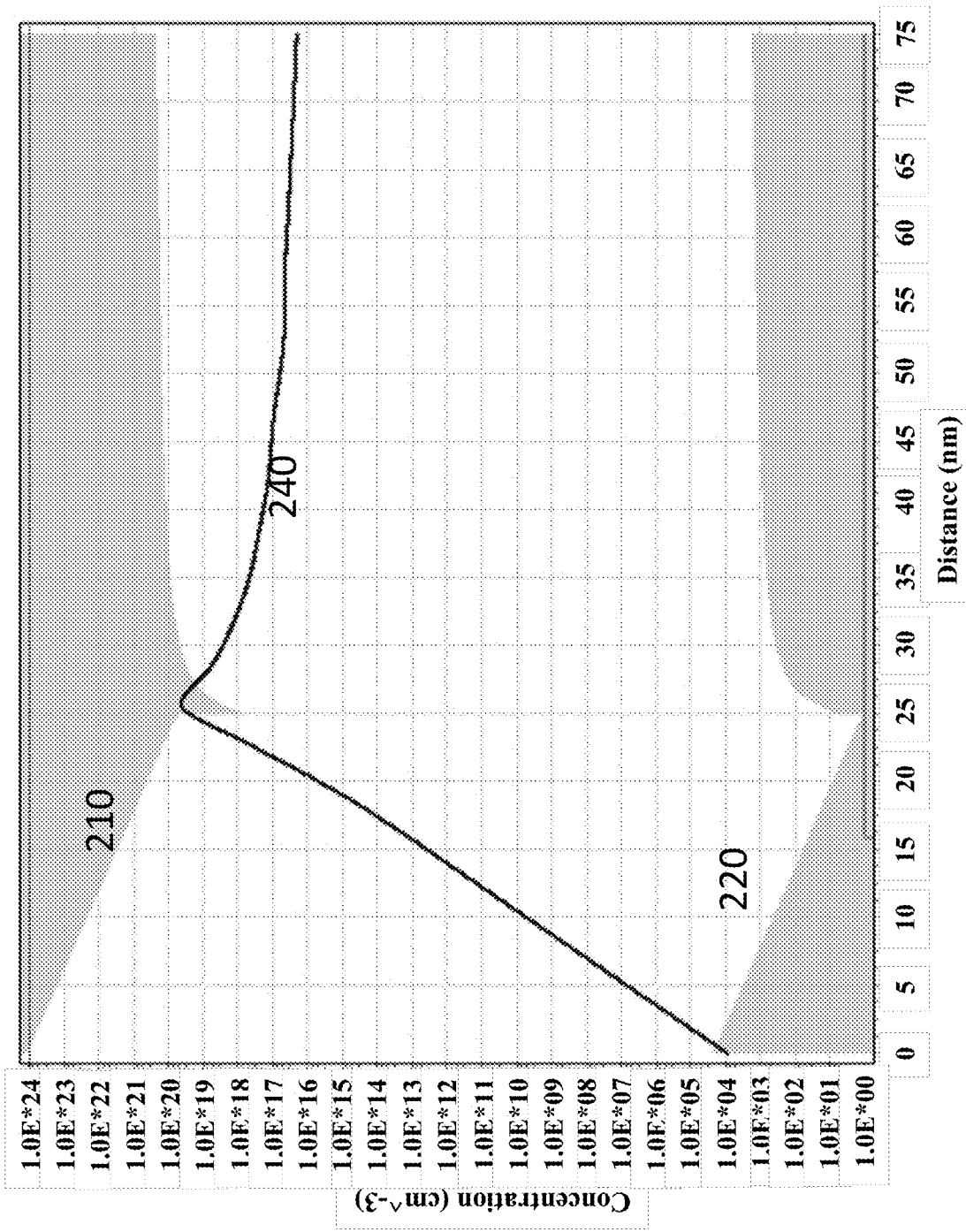
FIG. 2B is a graph illustrating that because of a polarization charge difference between GaN and AlGaN, 2-DHG is formed at the hetero-interface of GaN/AlGaN, showing an electron concentration that demonstrates an existence of 2-DEG, according to some embodiments of the present disclosure.

FIG. 2A is a graph illustrating that because of a polarization charge difference between the AlGaN and GaN, 2-DEG is formed at the hetero-interface of AlGaN/GaN, that a band diagram of AlGaN/GaN interface is shown, according to some embodiments of the present disclosure. FIG. 2A shows the conduction energy band labeled as 210, valance energy labeled as 220 and fermi level labeled as 230. As shown this the figure the fermi energy level crosses the conduction band at the interface of AlGaN GaN. This intrusion of fermi level in the conduction band leads the formation of dense electrons at the interface which is also known as 2-DEG FIG. 2B shows the electron concentration and demonstrates an existence of 2-DEG, according to some embodiments of the present disclosure. The profile labeled as 240 is the 2-DEG. The figure shows the 2-DEG density exceeding $10^20$ cm$^{-3}$.

Figure 3A:
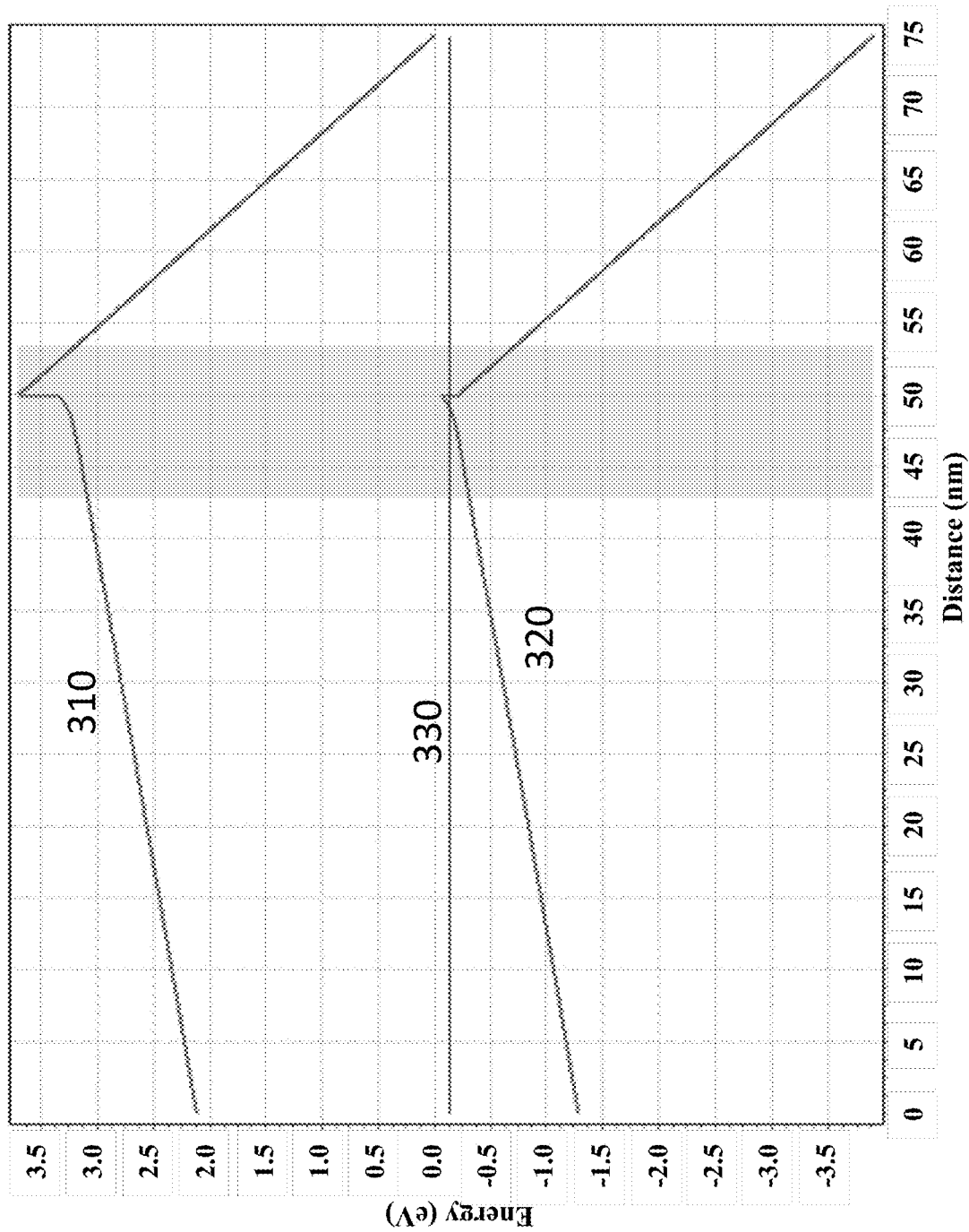
FIG. 3A is a graph illustrating a band diagram of GaN/AlGaN interface, according to some embodiments of the present disclosure.
Figure 3B:
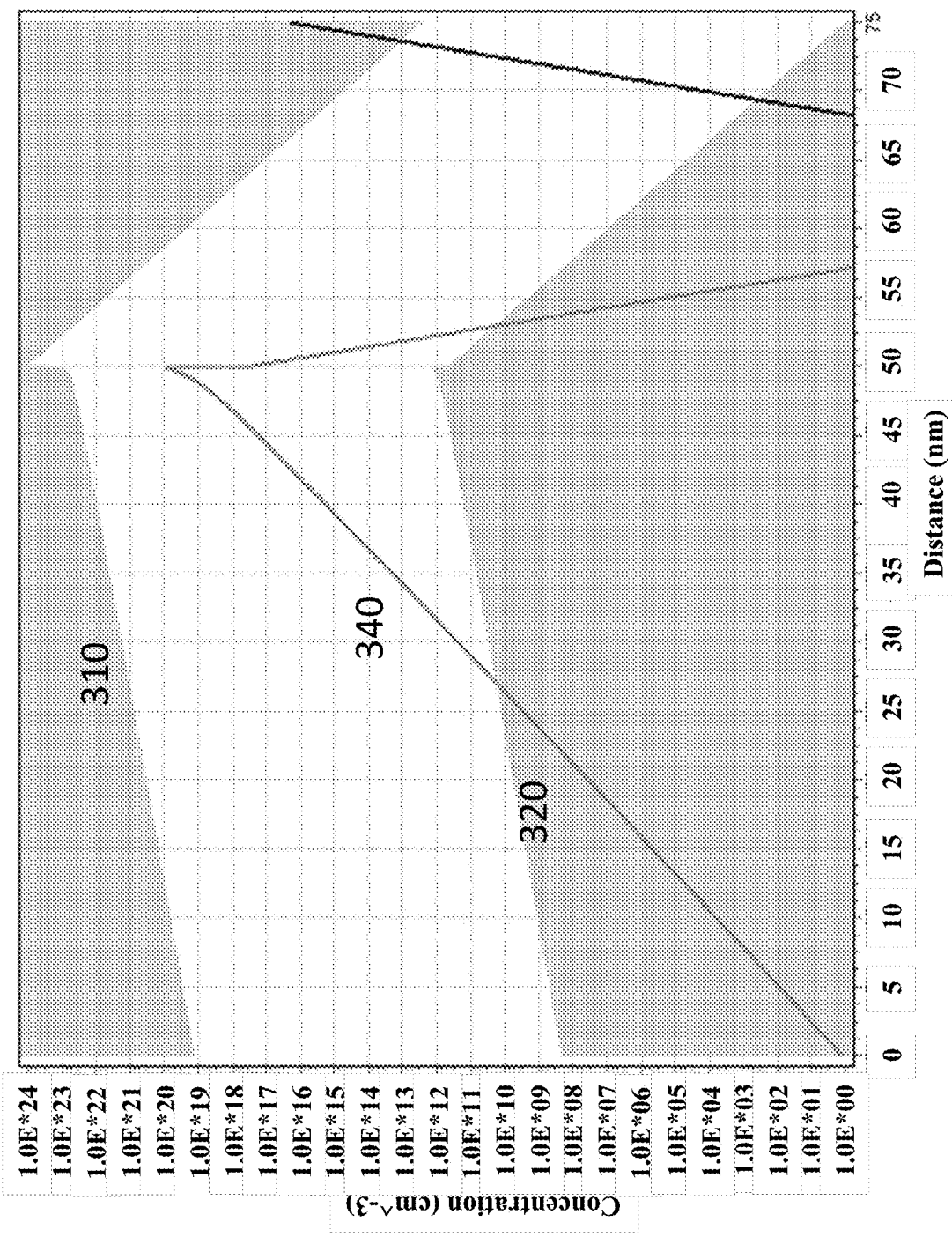
FIG. 3B is a graph illustrating a hole concentration that demonstrates an existence of 2-DHG, according to some embodiments of the present disclosure.

FIG. 3A is a graph illustrating a band diagram of GaN/AlGaN interface, according to some embodiments of the present disclosure. This fig. shows the conduction energy band labeled as 310, valance energy labeled as 320 and fermi level labeled as 330. As shown this the figure the fermi energy level crosses the valence band at the interface of GaN/AlGaN. This intrusion of fermi level in the valence band leads the formation of dense holes at the interface which is also known as 2-DHG FIG. 3B is a graph illustrating a hole concentration that demonstrates an existence of 2-DHG, according to some embodiments of the present disclosure; and The profile labeled as 340 is the 2-DHG. The figure shows the 2-DHG density around $10^{20}$ cm$^{-3}$.

Figure 4:
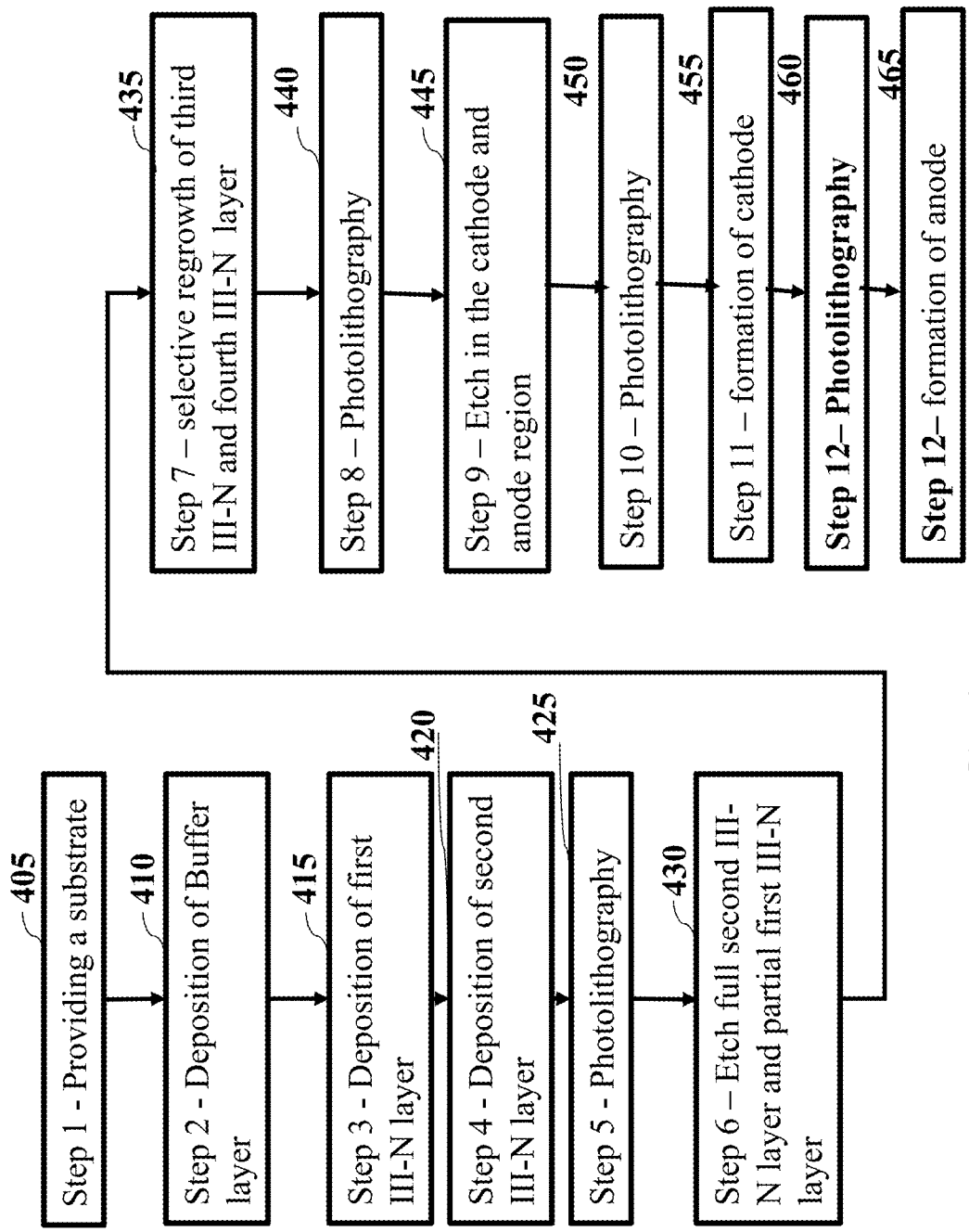
FIG. 4 is a block diagram illustrating a fabrication process of the transistor device, according to some embodiments of the present disclosure.

FIG. 4 is a block diagram illustrating a fabrication process of the semiconductor device, according to some embodiments of the present disclosure.

Step 405 shows the fabrication of an electronic device that starts with growing the epi-structure. And the process starts with Si/Sapphire/SiC/GaN wafers. And the size of the wafers could be 2/4/6/12 inches.

Step 410 shows that if the wafer is not a GaN wafer, then a buffer layer is grown to tackle the lattice mismatch between the wafer material and the III-N semiconductor.

Then, Step 415 shows GaN semiconductor grown on the buffer layer. This layer thickness could be in the range of 450 nm to several micro-meters. Ideally, the layer thickness is a thicker layer of GaN, as the thicker layer helps to reduce a defect density in the III-N layers which, in turn, helps to obtain optimum device performance. This is the first III-N layer according to some embodiment of the invention.

Then, Step 420 shows the second III-N layer grown on top of first III-N layer. But the III-N layer band gap needs to be higher than the GaN layer. Typically, a thickness of the second III-N layer can be 5 nm to 30 nm (typically this layer is AlGaN). The buffer layer, the first III-N layer and the second III-N layer can be grown by any growth method using one or a combination of metal organic chemical vapor deposition (MOCVD), Molecular beam epitaxy (MBE) or remote plasma chemical vapor deposition (RPCVD), pulsed laser deposition (PLD), Sputtering and so on.

Step 425 shows a photolithography that is needed to etch to semiconductor selectively for the formation of 2-DHG.

Step 430 shows that typically, the etching is done using ICP-RIE method employing Cl$_2$/BCl$_3$, /Ar gases. During this etching process the photoresist acts as mask to protect the region where etching is not desired.

Step 435 shows the selective regrowth of third and fourth III-N layers such that 2-DEG and 2-DHG forms a junction. The third III-N layer and the fourth III-N layer can be grown by any growth method using one or a combination of metal organic chemical vapor deposition (MOCVD), Molecular beam epitaxy (MBE) or remote plasma chemical vapor deposition (RPCVD), pulsed laser deposition (PLD), Sputtering and so on.

Step 440 shows the photolithography needed to open the window for etching the regions of anode and cathode.

Step 445 shows the etching step for the anode and cathode region. The etching is done using ICP-RIE method employing Cl$_2$/BCl$_3$, /Ar gases. During this etching process the photoresist acts as mask to protect the region where etching is not desired. The etch depth is precisely controlled so that it opens up the interface of both 2-DEG and 2-DHG.

Step 450 and 455 show the formation of Ti/Al/Ni/Au ohmic contact with photolithography and lift-off process in the cathode region with the 2-DEG. The ohmic contact in then annealed at high temperature. This ohmic contact serves as the cathode terminal.

Step 460 and 465 show the formation of Ni/Au ohmic contact with photolithography and lift-off process in the anode region with the 2-DHG. The ohmic contact in then annealed at high temperature. This ohmic contact serves as the anode terminal.

Features

A semiconductor device including a first region. The first region includes a first three Nitride (III-N) layer and a second III-N layer, such that the second III-N layer is over the first III-N. Wherein the second III-N layer has spontaneous polarization less than a spontaneous polarization of the first III-N layer, such that two-dimensional hole gas (2-DHG) will be formed at a junction of the first III-N layer to the second III-N layer. An Anode is arranged to form an ohmic contact to the 2-DHG at the junction of the first III-N layer to the second III-N layer. A second region includes a third III-N layer and a forth III-N layer, such that the fourth III-N layer is over the third III-N. Wherein the forth III-N layer has spontaneous polarization greater than a spontaneous polarization of the third III-N layer, such that two-dimensional electron gas (2-DEG) will be formed at a junction of the third III-N layer to the forth III-N layer. A Cathode is arranged to form an ohmic contact to the 2-DEG at the junction of the third III-N layer to the forth III-N layer. Wherein the first region and the second region are connected at a region interface that is a straight line, and that the 2-DHG and the 2-DEG are aligned to form a junction. The following aspects are intended to either individually or in combination, create one or more embodiments based on the one or more combination of aspects listed below.

An aspect can include that the first, second, third and fourth III-N layers are an Al$_x$In$_y$Ga$_{1-x-y}$N, such that a value of x and y is between 0 and 1 ($0 \leq x \leq 1$), ($0 \leq y \leq 1$), and wherein each x and y value are different. Another aspect may be that the first, second, third and fourth III-N layers are grown using one or a combination of metal organic chemical vapor deposition (MOCVD), Molecular beam epitaxy (MBE) or remote plasma chemical vapor deposition (RPCVD). Contemplated is that an aspect can be that the first, second, third and fourth III-N layers are unintentionally doped.

Another aspect may be that the Anode ohmic contact is formed by Nickel and Gold (Ni/Au), and an annealing of the Anode ohmic contact is in an oxygen environment at 550 C. Wherein an aspect can include that the Nickel and Gold (Ni/Au) are deposited by one of electron beam evaporation or a sputtering method. Another aspect may be that a thickness of the Nickel (Ni) is 20 nm, and a thickness of the Gold (Au) is 50 nm.

Another aspect may be that the Cathode ohmic contact is formed by Titanium and Aluminum and Nickel and Gold (Ti/Al/Ni/Au), and an annealing of the Cathode ohmic contact is in a Nitrogen environment at 800 C. Wherein an aspect may be that the Titanium and Aluminum and Nickel and Gold (Ti/Al/Ni/Au) are deposited by either electron beam evaporation or sputtering method. Another aspect can be that a thickness of Titanium (Ti) is 20 nm, Aluminum is 100 nm, Nickel is 25 nm and Gold (Au) is 50 nm.

Another aspect can be that the semiconductor device operates as an uni-directional electronic device such as a diode, so as to allow current to flow in one direction from the Anode to the Cathode, when a positive voltage is applied to the Anode with respect to the Cathode, and as well as blocks a conduction in an opposite direction from the Cathode to the Anode. Still another aspect may be that the semiconductor device is operational at cryogenic temperatures.

An aspect may be that the first region includes a base layer, a buffer layer over the base layer, such that the first III-N layer is over the buffer layer. Wherein the second region includes a base layer, a buffer layer over the base layer, such that the third III-N layer is over the buffer layer. An aspect can be that the Anode and the Cathode are electrically connected to the 2DGH so that current flows between the 2DGH and the 2DEG.

An aspect may be that the first, second, third and fourth III-N layers are an AlxInyGa1-x-yN, such that a value of x and y is between 0 and 1 (0≤x≤51), (0≤y≤1), and wherein each x and y value are different. Another aspect can be that the Anode ohmic contact is formed by Nickel and Gold (Ni/Au), and wherein a thickness of the Nickel (Ni) is 20 nm and a thickness of the Gold (Au) is 50 nm.

An aspect can be that the semiconductor device operates as an uni-directional electronic device such as a diode, so as to allow current to flow in one direction from the Anode to the Cathode, when a positive voltage is applied to the Anode with respect to the Cathode, and as well as blocks a conduction in an opposite direction from the Cathode to the Anode. Yet, another aspect can be that the Cathode ohmic contact is formed by Titanium and Aluminum and Nickel and Gold (Ti/Al/Ni/Au), and wherein a thickness of Titanium (Ti) is 20 nm, Aluminum is 100 nm, Nickel is 25 nm and Gold (Au) is 50 nm.

Definitions

According to aspects of the present disclosure, and based on experimentation, the following definitions have been established, and certainly are not a complete definition of each phrase or term. Wherein the provided definitions are merely provided as an example, based upon learnings from experimentation, wherein other interpretations, definitions, and other aspects may pertain. However, for at least a mere basic preview of the phrase or term presented, such definitions have been provided. Further, the definitions below can not be viewed as prior art since the knowledge gained is from experimentation.

Depletion Width: In semiconductor physics, the depletion region, also called depletion layer, depletion zone, junction region, space charge region or space charge layer, is an insulating region within a conductive, doped semiconductor material where the mobile charge carriers have been diffused away, or have been forced away by an electric field. The only elements left in the depletion region are ionized donor or acceptor impurities. The depletion region is so named because it is formed from a conducting region by removal of all free charge carriers, leaving none to carry a current. Understanding the depletion region is key to explaining modern semiconductor electronics: diodes, bipolar junction transistors, field-effect transistors, and variable capacitance diodes all rely on depletion region phenomena. A depletion region forms instantaneously across a p-n junction. It is most easily described when the junction is in thermal equilibrium or in a steady state: in both of these cases the properties of the system do not vary in time; they have been called dynamic equilibrium. Electrons and holes diffuse into regions with lower concentrations of them, much as ink diffuses into water until it is uniformly distributed. By definition, the N-type semiconductor has an excess of free electrons (in the conduction band) compared to the P-type semiconductor, and the P-type has an excess of holes (in the valence band) compared to the N-type. Therefore, when N-doped and P-doped semiconductors are placed together to form a junction, free electrons in the N-side conduction band migrate (diffuse) into the P-side conduction band, and holes in the P-side valence band migrate into the N-side valence band. Following transfer, the diffused electrons come into contact with holes and are eliminated by recombination in the P-side. Likewise, the diffused holes are recombined with free electrons so eliminated in the N-side. The net result is that the diffused electrons and holes are gone. In a N-side region near to the junction interface, free electrons in the conduction band are gone due to (1) the diffusion of electrons to the P-side and (2) recombination of electrons to holes that are diffused from the P-side. Holes in a P-side region near to the interface are also gone by a similar reason. As a result, majority charge carriers (free electrons for the N-type semiconductor, and holes for the P-type semiconductor) are depleted in the region around the junction interface, so this region is called the depletion region or depletion zone. Due to the majority charge carrier diffusion described above, the depletion region is charged; the N-side of it is positively charged and the P-side of it is negatively charged. This creates an electric field that provides a force opposing the charge diffusion. When the electric field is sufficiently strong to cease further diffusion of holes and electrons, the depletion region reached the equilibrium. Integrating the electric field across the depletion region determines what is called the built-in voltage (also called the junction voltage or barrier voltage or contact potential). Physically speaking, charge transfer in semiconductor devices is from (1) the charge carrier drift by the electric field and (2) the charge carrier diffusion due to the spatially varying carrier concentration. In the P-side of the depletion region, where holes drift by the electric field with the electrical conductivity a and diffuse with the diffusion constant D, the net current density is given by $J=\sigma E - eD\nabla p$, where E is the electric field, e is the elementary charge (1.6×10−19 coulomb), and p is the hole density (number per unit volume). The electric field make holes' drift along the field direction, and for diffusion holes move in the direction of decreasing concentration, so for holes a negative current result for a positive density gradient. (If the carriers are electrons, the hole density p is replaced by the electron density n with negative sign; in some cases, both electrons and holes must be included.) When the two current components balance, as in the p-n junction depletion region at dynamic equilibrium, the current is zero due to the Einstein relation, which relates D to a.

Depletion width in regard to forward bias, forward bias is (applying a positive voltage to the P-side with respect to the N-side) narrows the depletion region and lowers the barrier to carrier injection. In more detail, majority carriers get some energy from the bias field, enabling them to go into the region and neutralize opposite charges. The more bias the more neutralization (or screening of ions in the region) occurs. The carriers can be recombined to the ions but thermal energy immediately makes recombined carriers transition back as Fermi energy is in proximity. When bias is strong enough that the depletion region becomes very thin, the diffusion component of the current (through the junction interface) greatly increases and the drift component decreases. In this case, the net current flows from the P-side to the N-side. The carrier density is large (it varies exponentially with the applied bias voltage), making the junction conductive and allowing a large forward current. The mathematical description of the current is provided by the Shockley diode equation. The low current conducted under reverse bias and the large current under forward bias is an example of rectification. In regard to reverse bias, (applying a negative voltage to the P-side with respect to the N-side), the potential drop (i.e., voltage) across the depletion region increases. Essentially, majority carriers are pushed away from the junction, leaving behind more charged ions. Thus, the depletion region is widened and its field becomes stronger, which increases the drift component of current (through the junction interface) and decreases the diffusion component. In this case, the net current flows from the N-side to the P-side. The carrier density (mostly, minority carriers) is small and only a very small reverse saturation current flow.

Qubit: The qubit or quantum bit is the basic container of information in a QC, replacing the bit in a conventional computer. The qubit can be in both ground and excited states at the same time. The two logical states of each qubit must be mapped onto the eigenstates of some suitable physical system. The most straightforward example is the spin. A spin qubit relies on a spin degree of freedom of either electronic or nuclear nature, which can hold a bit of quantum information for very long times. Note that there are many other examples of qubits: two different polarizations of a photon, two energy states of an electron orbiting a single atom, etc. The quantum computer is fundamentally different than a classical computer due to two distinct properties of qubits. The first property is 'quantum superposition' or the linear combination of possible configurations. The second one is 'quantum entanglement'.

Heterojunction: A heterojunction is the interface that occurs between two layers or regions of dissimilar crystalline semiconductors. These semiconducting materials have unequal band gaps as opposed to a homojunction. It is often advantageous to engineer the electronic energy bands in many solid-state device applications, including semiconductor lasers, solar cells and transistors to name a few. The combination of multiple heterojunctions together in a device is called a heterostructure, although the two terms are commonly used interchangeably. The requirement that each material be a semiconductor with unequal band gaps is somewhat loose, especially on small length scales, where electronic properties depend on spatial properties. A more modern definition of heterojunction is the interface between any two solid-state materials, including crystalline and amorphous structures of metallic, insulating, fast ion conductor and semiconducting materials.

Effective Mass Mismatch (heterojunction): When a heterojunction is formed by two different semiconductors, a quantum well can be fabricated due to difference in band structure. In order to calculate the static energy levels within the achieved quantum well, understanding variation or mismatch of the effective mass across the heterojunction becomes substantial. The quantum well defined in the heterojunction can be treated as a finite well potential with width of $l_w$. Boundary condition for the envelope function in quantum well, known as Ben Daniel-Duke boundary condition, such that the envelope function in fabricated quantum well must satisfy boundary condition which $$\psi(z), \frac{1}{m^*}\frac{\partial}{\partial z}\psi(z)$$

are both continuous in interface regions.

Manufacture (heterojunction): Heterojunction manufacturing generally requires the use of molecular beam epitaxy (MBE) or chemical vapor deposition (CVD) technologies in order to precisely control the deposition thickness and create a cleanly lattice-matched abrupt interface. Commonly, there are two steps for manufacturing heterojunction:

Preparation of Two-dimensional layered materials. The synthesis of 2D monolayers mainly include the top-down strategy and the bottom-up strategy.

Top-down: Micromechanical Exfoliation. Simple as it seems, this technique is able to yield high-quality 2D crystal flaks, applied to many common-used 2D materials, such as graphene, $MoS_2$, $WSe_2$.

Bottom-up: Chemical vapor deposition (CVD). This method is mainly used to prepare larger films with more stable quality. One of the most popular application is to adopt it for growing $MoS_2$ uses S and $MoO_3$ as precursors.

Heterostructure assembly. Van der Waals heterojunction (vdWH) can be fabricated by staking prepared monolayer. Both top-down and bottom-up approaches can be applied.

Top-down: Exfoliation and restacking approach. The first layer should be attached onto a substrate. The second layer can be transferred onto a transparent stamp with sacrificial polymer by wet or dry transfer techniques. The stacking of sheets should be precisely conducted under micromanipulators, and then remove the polymer stamp. This is the most widely applied method.

Bottom-up: Direct CVD growth of heterostructure layers on top of each other. The growing conditions need to be precisely controlled. For example, graphene, h-BN and TMD vdWHs can be prepared this way.

Energy Band Alignment (heterojunction): The behavior of a semiconductor junction depends crucially on the alignment of the energy bands at the interface. Semiconductor interfaces can be organized into three types of heterojunctions: straddling gap (type I), staggered gap (type II) or broken gap (type III) as seen in the figure. Away from the junction, the band bending can be computed based on the usual procedure of solving Poisson's equation. Various models exist to predict the band alignment.

The simplest (and least accurate) model is Anderson's rule, which predicts the band alignment based on the properties of vacuum-semiconductor interfaces (in particular the vacuum electron affinity). The main limitation is its neglect of chemical bonding.

A common anion rule was proposed which guesses that since the valence band is related to anionic states, materials with the same anions should have very small valence band offsets. This however did not explain the data but is related to the trend that two materials with different anions tend to have larger valence band offsets than conduction band offsets.

Tersoff proposed a gap state model based on more familiar metal-semiconductor junctions where the conduction band offset is given by the difference in Schottky barrier height. This model includes a dipole layer at the interface between the two semiconductors which arises from electron tunneling from the conduction band of one material into the gap of the other (analogous to metal-induced gap states). This model agrees well with systems where both materials are closely lattice matched such as GaAs/AlGaAs.

The 60:40 rule is a heuristic for the specific case of junctions between the semiconductor GaAs and the alloy semiconductor $Al_xGa_{1-x}As$. As the x in the $Al_xGa_{1-x}As$ side is varied from 0 to 1, the ratio $\Delta E_C/\Delta E_V$ tends to maintain the value 60/40. For comparison, Anderson's rule predicts $\Delta E_C/\Delta E_V=0.73/0.27$ for a GaAs/AlAs junction (x=1).

The typical method for measuring band offsets is by calculating them from measuring exciton energies in the luminescence spectra.

Superconductor-electronics (SCE): Superconducting logic refers to a class of logic circuits or logic gates that use the unique properties of superconductors, including zero-resistance wires, ultrafast Josephson junction switches, and quantization of magnetic flux (fluxoid). Superconducting computing is a form of cryogenic computing, as superconductive electronic circuits require cooling to cryogenic temperatures for operation, typically below 10 kelvin. Often superconducting computing is applied to quantum computing, with an important application known as superconducting quantum computing.

Digital superconductor electronics (DSE) based on single flux quantum (SFQ) logic: DSE based pm SFQ is currently available commercially in several logic families at an integration level up to about one million devices per chip.

Polarization based doping: is an effective way to circumvent the problem of carrier freez-out effect since the carriers in this type of method are not provided by the dopants. Conventional electronics do not work properly in sub-4 K temperature because of carrier freez-out effect.

Polarization doping to generate free electrons and free holes: In physics, a charge carrier is a particle or quasiparticle that is free to move, carrying an electric charge, especially the particles that carry electric charges in electrical conductors. Examples are electrons, ions and holes. In a conducting medium, an electric field can exert force on these free particles, causing a net motion of the particles through the medium; this is what constitutes an electric current. In conducting media, particles serve to carry charge:

In semiconductors, which are the material used to make electronic components like transistors and integrated circuits, behave as if "effective particles" known as electron holes with positive charge move through them, causing electrical properties. The "holes" behave as the traveling vacancies in the valence-band electron population of the semi-conductor and are treated as charge carriers. Electrons and holes are the charge carriers in semiconductors.

There are two recognized types of charge carriers in semiconductors. One is electrons, which carry a negative electric charge. In addition, it is convenient to treat the traveling vacancies in the valence band electron population (holes) as a second type of charge carrier, which carry a positive charge equal in magnitude to that of an electron.

Free carrier concentration is the concentration of free carriers in a doped semiconductor. It is similar to the carrier concentration in a metal and for the purposes of calculating currents or drift velocities can be used in the same way. Free carriers are electrons (or holes) which have been introduced directly into the conduction band (or valence band) by doping and are not promoted thermally. For this reason, electrons (holes) will not act as double carriers by leaving behind holes (electrons) in the other band. In other words, charge carriers are particles/electrons that are free to move (carry the charge).

Electron hole or holes in quantum chemistry: An alternate meaning for the term electron hole is used in computational chemistry. In coupled cluster methods, the ground (or lowest energy) state of a molecule is interpreted as the "vacuum state"—conceptually, in this state there are no electrons. In this scheme, the absence of an electron from a normally filled state is called a "hole" and is treated as a particle, and the presence of an electron in a normally empty state is simply called an "electron". This terminology is almost identical to that used in solid-state physics.

Polarization charge: Fermi level: The Fermi level of a solid-state body is the thermodynamic work required to add one electron to the body. It is a thermodynamic quantity usually denoted by $\mu$ or EF, for brevity. The Fermi level does not include the work required to remove the electron from wherever it came from. A precise understanding of the Fermi level—how it relates to electronic band structure in determining electronic properties, how it relates to the voltage and flow of charge in an electronic circuit—is essential to an understanding of solid-state physics.

In band structure theory, used in solid state physics to analyze the energy levels in a solid, the Fermi level can be considered to be a hypothetical energy level of an electron, such that at thermodynamic equilibrium this energy level would have a 50% probability of being occupied at any given time. The position of the Fermi level in relation to the band energy levels is a crucial factor in determining electrical properties. The Fermi level does not necessarily correspond to an actual energy level (in an insulator the Fermi level lies in the band gap), nor does it require the existence of a band structure. Nonetheless, the Fermi level is a precisely defined thermodynamic quantity, and differences in Fermi level can be measured simply with a voltmeter.

Embodiments

The following description provides exemplary embodiments only, and is not intended to limit the scope, applicability, or configuration of the disclosure. Rather, the following description of the exemplary embodiments will provide those skilled in the art with an enabling description for implementing one or more exemplary embodiments. Contemplated are various changes that may be made in the function and arrangement of elements without departing from the spirit and scope of the subject matter disclosed as set forth in the appended claims.

Specific details are given in the following description to provide a thorough understanding of the embodiments. However, understood by one of ordinary skill in the art can be that the embodiments may be practiced without these specific details. For example, systems, processes, and other elements in the subject matter disclosed may be shown as components in block diagram form in order not to obscure the embodiments in unnecessary detail. In other instances, well-known processes, structures, and techniques may be shown without unnecessary detail in order to avoid obscuring the embodiments. Further, like reference numbers and designations in the various drawings indicated like elements.

In addition, individual embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process may be terminated when its operations are completed, but may have additional steps not discussed or included in a figure. Furthermore, not all operations in any particularly described process may occur in all embodiments. A process may correspond to a method, a function, a procedure, a subroutine, a subprogram, etc. When a process corresponds to a function, the function's termination can correspond to a return of the function to the calling function or the main function.

Furthermore, embodiments of the subject matter disclosed may be implemented, at least in part, either manually or automatically. Manual or automatic implementations may be executed, or at least assisted, with machines, hardware, software, firmware, middleware, microcode, hardware description languages, or any combination thereof. When implemented in software, firmware, middleware or microcode, the program code or code segments to perform the necessary tasks may be stored in a machine-readable medium. A processor(s) may perform the necessary tasks.

Further, embodiments of the present disclosure and the functional operations described in this specification can be implemented in digital electronic circuitry, in tangibly embodied computer software or firmware, in computer hardware, including the structures disclosed in this specification and their structural equivalents, or in combinations of one or more of them. Further, some embodiments of the present disclosure can be implemented as one or more computer programs, i.e., one or more modules of computer program instructions encoded on a tangible non-transitory program carrier for execution by, or to control the operation of, data processing apparatus. Further still, program instructions can be encoded on an artificially generated propagated signal, e.g., a machine-generated electrical, optical, or electromagnetic signal that is generated to encode information for transmission to suitable receiver apparatus for execution by a data processing apparatus. The computer storage medium can be a machine-readable storage device, a machine-readable storage substrate, a random or serial access memory device, or a combination of one or more of them.

According to embodiments of the present disclosure, the term "data processing apparatus" can encompass all kinds of apparatus, devices, and machines for processing data, including by way of example a programmable processor, a computer, or multiple processors or computers. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, or a combination of one or more of them.

A computer program (which may also be referred to or described as a program, software, a software application, a module, a software module, a script, or code) can be written in any form of programming language, including compiled or interpreted languages, or declarative or procedural languages, and it can be deployed in any form, including as a stand-alone program or as a module, component, subroutine, or other unit suitable for use in a computing environment. A computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub programs, or portions of code. A computer program can be deployed to be executed on one computer or on multiple computers that are located at one site or distributed across multiple sites and interconnected by a communication network. Computers suitable for the execution of a computer program include, by way of example, can be based on general or special purpose microprocessors or both, or any other kind of central processing unit. Generally, a central processing unit will receive instructions and data from a read only memory or a random-access memory or both. The essential elements of a computer are a central processing unit for performing or executing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

Embodiments of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), e.g., the Internet.

The computing system can include clients and servers. A client and server are generally remote from each other and typically interact through a communication network. The relationship of client and server arises by virtue of computer programs running on the respective computers and having a client-server relationship to each other.

Although the present disclosure has been described with reference to certain preferred embodiments, it is to be understood that various other adaptations and modifications can be made within the spirit and scope of the present disclosure. Therefore, it is the aspect of the append claims to cover all such variations and modifications as come within the true spirit and scope of the present disclosure.

What is claimed is:

1. A semiconductor device, comprising:
a first region includes
a first three Nitride (III-N) layer and a second III-N layer, such that the second III-N layer is over the first III-N, wherein the second III-N layer has spontaneous polarization less than a spontaneous polarization of the first III-N layer, and such that a two-dimensional hole gas (2-DHG) will be formed at a junction of the first III-N layer to the second III-N layer;
an Anode is arranged to form an ohmic contact to the 2-DHG at the junction of the first III-N layer to the second III-N layer;
a second region includes
a third III-N layer and a fourth III-N layer, such that the fourth III-N layer is over the third III-N, wherein the fourth III-N layer has spontaneous polarization greater than a spontaneous polarization of the third III-N layer, such that two-dimensional electron gas (2-DEG) will be formed at a junction of the third III-N layer to the fourth III-N layer; and
a Cathode is arranged to form an ohmic contact to the 2-DEG at the junction of the third III-N layer to the fourth III-N layer,
wherein the first region and the second region are connected at a region interface that is a straight line, and that the 2-DHG and the 2-DEG are aligned to form a junction.

2. The semiconductor device according to claim 1, wherein the first, second, third and fourth III-N layers are an AlxInyGa1-x-yN, such that a value of x and y is between 0 and 1 (0≤x≤1), (0≤y≤1), and wherein each x and y value are different.

3. The semiconductor device according to claim 1, wherein the first, second, third and fourth III-N layers are grown using one or a combination of metal organic chemical vapor deposition (MOCVD), Molecular beam epitaxy (MBE) or remote plasma chemical vapor deposition (RPCVD).

4. The semiconductor device according to claim 1, wherein the first, second, third and fourth III-N layers are unintentionally doped.

5. The semiconductor device according to claim 1, wherein the Anode ohmic contact is formed by Nickel and Gold (Ni/Au), and an annealing of the Anode ohmic contact is in an oxygen environment at 550 C.

6. The semiconductor device according to claim 5, wherein the Nickel and Gold (Ni/Au) are deposited by one of electron beam evaporation or a sputtering method.

7. The semiconductor device according to claim 5, wherein a thickness of the Nickel (Ni) is 20 nm, and a thickness of the Gold (Au) is 50 nm.

8. The semiconductor device according to claim 1, wherein the Cathode ohmic contact is formed by Titanium and Aluminum and Nickel and Gold (Ti/Al/Ni/Au), and an annealing of the Cathode ohmic contact is in a Nitrogen environment at 800 C.

9. The semiconductor device according to claim 8, wherein the Titanium and Aluminum and Nickel and Gold (Ti/Al/Ni/Au) are deposited by either electron beam evaporation or sputtering method.

10. The semiconductor device according to claim 8, wherein a thickness of Titanium (Ti) is 20 nm, Aluminum is 100 nm, Nickel is 25 nm and Gold (Au) is 50 nm.

11. The semiconductor device according to claim 1, wherein the semiconductor device operates as an uni-directional electronic device such as a diode, so as to allow current to flow in one direction from the Anode to the Cathode, when a positive voltage is applied to the Anode with respect to the Cathode, and as well as blocks a conduction in an opposite direction from the Cathode to the Anode.

12. The semiconductor device according to claim 1, wherein the semiconductor device is operational at cryogenic temperatures.

13. The semiconductor device according to claim 1, wherein the first region includes
a base layer,
a buffer layer over the base layer, wherein the first III-N layer is over the buffer layer, and
wherein the second region includes
a base layer,
a buffer layer over the base layer, wherein the third III-N layer is over the buffer layer.

14. The semiconductor device according to claim 1, wherein the Anode and the Cathode are electrically connected to the 2-DHG so that current flows between the 2-DHG and the 2-DEG.

15. A semiconductor device, comprising:
a first region includes
a first three Nitride (III-N) layer and a second III-N layer, such that the second III-N layer is over the first III-N, wherein the second III-N layer has spontaneous polarization less than a spontaneous polarization of the first III-N layer, such that two-dimensional hole gas (2-DHG) will be formed at a junction of the first III-N layer to the second III-N layer;
an Anode is arranged to form an ohmic contact to the 2-DHG at the junction of the first III-N layer to the second III-N layer;
a second region includes
a third III-N layer and a fourth III-N layer, such that the fourth III-N layer is over the third III-N, wherein the fourth III-N layer has spontaneous polarization greater than a spontaneous polarization of the third III-N layer, such that two-dimensional electron gas (2-DEG) will be formed at a junction of the third III-N layer to the fourth III-N layer; and
a Cathode is arranged to form an ohmic contact to the 2-DEG at the junction of the third III-N layer to the fourth III-N layer, wherein a current flows from the Anode to the Cathode, when a positive voltage is applied to the Anode with respect to the Cathode,
wherein the first region and the second region are connected at a region interface that is a straight line, and that the 2-DHG and the 2-DEG are aligned to form a junction.

16. The semiconductor device according to claim 15, wherein the first, second, third and fourth III-N layers are an AlxInyGa1-x-yN, such that a value of x and y is between 0 and 1 (0≤x≤1), (0≤y≤1), and wherein each x and y value are different.

17. The semiconductor device according to claim 15, wherein the Anode ohmic contact is formed by Nickel and Gold (Ni/Au), and wherein a thickness of the Nickel (Ni) is 20 nm and a thickness of the Gold (Au) is 50 nm.

18. A semiconductor device, comprising:
a first region includes
a first three Nitride (III-N) layer and a second III-N layer, such that the second III-N layer is over the first III-N, wherein the second III-N layer has spontaneous polarization less than a spontaneous polarization of the first III-N layer, such that two-dimensional hole gas (2-DHG) will be formed at a junction of the first III-N layer to the second III-N layer;
an Anode is arranged to form an ohmic contact to the 2-DHG at the junction of the first III-N layer to the second III-N layer;
a second region includes
a third III-N layer and a fourth III-N layer, such that the fourth III-N layer is over the third III-N, wherein the fourth III-N layer has spontaneous polarization greater than a spontaneous polarization of the third III-N layer, such that two-dimensional electron gas (2-DEG) will be formed at a junction of the third III-N layer to the fourth III-N layer; and
a Cathode is arranged to form an ohmic contact to the 2-DEG at the junction of the third III-N layer to the fourth III-N layer,
wherein the first region and the second region are connected at a region interface that is a straight line, and wherein a junction is formed between the 2-DHG and the 2-DEG that forms a depletion width that is varied by applying bias at the Anode with respect to the Cathode.

19. The semiconductor device according to claim 18, wherein the semiconductor device operates as an uni-directional electronic device such as a diode, so as to allow current to flow in one direction from the Anode to the Cathode, when a positive voltage is applied to the Anode with respect to the Cathode, and as well as blocks a conduction in an opposite direction from the Cathode to the Anode.

20. The semiconductor device according to claim 18, wherein the Cathode ohmic contact is formed by Titanium and Aluminum and Nickel and Gold (Ti/Al/Ni/Au), and wherein a thickness of Titanium (Ti) is 20 nm, Aluminum is 100 nm, Nickel is 25 nm and Gold (Au) is 50 nm.

* * * * *